(12) United States Patent
Yamashita

(10) Patent No.: US 9,293,318 B2
(45) Date of Patent: Mar. 22, 2016

(54) SEMICONDUCTOR WAFER MANUFACTURING METHOD

(71) Applicant: SUMCO TECHXIV CORPORATION, Nagasaki (JP)

(72) Inventor: Kenji Yamashita, Tokyo (JP)

(73) Assignee: SUMCO TECHXIV CORPORATION, Nagasaki (JP)

( * ) Notice: Subject to any disclaimer, the term of this patent is extended or adjusted under 35 U.S.C. 154(b) by 0 days.

(21) Appl. No.: 14/406,625

(22) PCT Filed: Jun. 12, 2013

(86) PCT No.: PCT/JP2013/066230
§ 371 (c)(1),
(2) Date: Dec. 9, 2014

(87) PCT Pub. No.: WO2013/187441
PCT Pub. Date: Dec. 19, 2013

(65) Prior Publication Data
US 2015/0162181 A1 Jun. 11, 2015

(30) Foreign Application Priority Data
Jun. 12, 2012 (JP) ................................. 2012-132637

(51) Int. Cl.
| H01L 21/302 | (2006.01) |
| H01L 21/02 | (2006.01) |
| B24B 37/08 | (2012.01) |
| B24B 9/06 | (2006.01) |

(52) U.S. Cl.
CPC .......... *H01L 21/02024* (2013.01); *B24B 9/065* (2013.01); *B24B 37/08* (2013.01); *H01L 21/02013* (2013.01); *H01L 21/02021* (2013.01); *H01L 21/0223* (2013.01); *H01L 21/02052* (2013.01); *H01L 21/02087* (2013.01)

(58) Field of Classification Search
None
See application file for complete search history.

(56) References Cited

U.S. PATENT DOCUMENTS

| 6,174,222 B1 * | 1/2001 | Sato et al. ........................ 451/44 |
| 2003/0022495 A1 * | 1/2003 | Netsu et al. .................. 438/689 |
| 2004/0045580 A1 | 3/2004 | Kurita et al. |

(Continued)

FOREIGN PATENT DOCUMENTS

| JP | 2001-345291 | * 12/2001 |
| JP | 2002-43390 | 2/2002 |

(Continued)

OTHER PUBLICATIONS

English language translation of International Preliminary Report on Patentability in PCT/JP2013/066230, mail date is Dec. 16, 2014.

(Continued)

*Primary Examiner* — Shamim Ahmed
(74) *Attorney, Agent, or Firm* — Greenblum & Bernstein, P.L.C.

(57) ABSTRACT

A method of manufacturing a semiconductor wafer includes: rough-polishing front and back surfaces of the semiconductor wafer; mirror-polishing a chamfered portion of the rough-polished semiconductor wafer; performing mirror finish polishing on the front surface or both the front and back surfaces of the semiconductor wafer having the mirror-polished chamfered portion; and forming an oxide film on an entire surface of the semiconductor wafer after the mirror-polishing of the chamfered portion and before the mirror finish polishing.

5 Claims, 8 Drawing Sheets

(56) References Cited

U.S. PATENT DOCUMENTS

| | | | |
|---|---|---|---|
| 2008/0072926 A1* | 3/2008 | Munakata | 134/2 |
| 2009/0203212 A1* | 8/2009 | Ichikawa et al. | 438/691 |
| 2011/0132255 A1* | 6/2011 | Kinbara et al. | 117/106 |
| 2012/0100701 A1* | 4/2012 | Kawasaki | 438/478 |

FOREIGN PATENT DOCUMENTS

| | | |
|---|---|---|
| JP | 2003-142434 | 5/2003 |
| JP | 2004-193534 | 7/2004 |
| JP | 2006-237055 | 9/2006 |
| KR | 10-2003-0053085 | 6/2003 |
| KR | 10-0486144 | 4/2005 |
| KR | 10-2008-0022511 | 3/2008 |

OTHER PUBLICATIONS

Search report from International Patent Appl. No. PCT/JP2013/066230, mail date is Sep. 3, 2013.

Korean Official Action in Application No. 10-2014-7034907 and English translation thereof, dated Jan. 12, 2016.

\* cited by examiner

SEMICONDUCTOR WAFER MANUFACTURING METHOD

TECHNICAL FIELD

The present invention relates to a method of manufacturing a semiconductor wafer.

BACKGROUND ART

Typically, front and back surfaces of a semiconductor wafer are mirror-polished by a plurality of steps. Specifically, the steps mainly include rough polishing for providing a high flatness to a semiconductor wafer and final polishing for reducing surface roughness.

Further, in addition to the front and back surfaces of the semiconductor wafer, a chamfered portion is also mirror-polished to prevent generation of dust from the chamfered portion.

The rough polishing is a double-side simultaneous polishing, in which the semiconductor wafer is set in a carrier and both front and back surfaces of the semiconductor wafer are simultaneously polished. During the double-side simultaneous polishing, the chamfered portion is damaged or dented as a result of the contact of the semiconductor wafer with an inner lateral surface of the carrier. Accordingly, the mirror polishing of the chamfered portion is usually performed after the rough polishing so that possible damage and dent can be removed by the mirror polishing.

However, a soft polishing cloth, which is usually used for a polishing pad for the mirror polishing of the chamfered portion, is unintentionally applied not only to the chamfered portion but also to the surface of the wafer during the mirror polishing of the chamfered portion (hereinafter also referred to as "over-polishing"). As a result of over-polishing, the outer peripheral portion of the wafer is adversely thinned (hereinafter also referred to as "edge roll-off").

In order to prevent severe edge roll-off due to over-polishing as described above, a method of manufacturing a semiconductor wafer includes: double-side polishing a semiconductor wafer; forming a resin protection film on both front and back surfaces of the semiconductor wafer; mirror-polishing a chamfered portion of the semiconductor wafer; and removing the resin protection film (see, for instance, Patent Literature 1). According to Patent Literature 1, the resin protection film is formed on the front and back surfaces of the semiconductor wafer, thereby suppressing over-polishing of the front and back surfaces during the mirror polishing of the chamfered portion to prevent edge roll-off.

CITATION LIST

Patent Literature(s)

Patent Literature 1: JP-A-2006-237055

SUMMARY OF THE INVENTION

Problems to be Solved by the Invention

However, the method disclosed in Patent Literature 1 requires forming the protection film from a resin and cleaning for removing the resin protection film, which results in an increase in costs.

Further, when the resin for forming the protection film reaches the chamfered portion beyond the front and back surfaces, the chamfered portion is partly or entirely less mirror-polished. Accordingly, the protection film needs to be precisely formed only on the front and back surfaces of the wafer to prevent the resin from reaching the chamfered portion. However, such formation is technically difficult.

Further, the cleaning for removing the resin protection film has some problems. For instance, the removed resin may stick to the surface again and the resin protection film may not be fully removed.

An object of the invention is to provide a method of manufacturing a semiconductor wafer, the method being capable of improving the flatness of the outer peripheral portion of a surface of a semiconductor wafer.

Means for Solving the Problems

A polishing solution for rough polishing and a polishing solution for mirror finish polishing are usually different in abrasive grain size and compositional elements. Accordingly, a rough-polished semiconductor wafer is cleaned so that abrasive grains and polishing solution remaining on the surface of the semiconductor wafer are removed before the semiconductor wafer is subjected to the subsequent mirror finish polishing. For the cleaning, for instance, a cleaning solution (SC-1) containing ammonia water and hydrogen peroxide is used.

As a result of an experiment made by the present inventor(s), it has been found that when the front surface or both front and back surfaces of the semiconductor wafer are subjected to mirror finish polishing after a chamfered portion of the semiconductor wafer is mirror-polished after the semiconductor surface is rough-polished and cleaned, the flatness of the outer peripheral portion of the surface of the semiconductor wafer is deteriorated.

As a result of intensive research on the reason for the above problem, the following findings have been reached.

When the semiconductor wafer is subjected to cleaning (e.g., SC-1 cleaning), an oxide film with an angstrom-order thickness is necessarily formed on the entire surface of the cleaned semiconductor wafer.

On the other hand, as a result of the recent progress of the development of a mirror-polishing technique for a chamfered portion of a wafer, for instance, types of usable polishing cloth or slurry are improved sufficiently to hardly cause edge roll-off resulting from over-polishing.

However, as shown in FIG. 8A, an ultra-thin oxide film formed when the semiconductor wafer is cleaned is unintentionally over-polished during the mirror polishing of the chamfered portion, so that the oxide film present on the outer peripheral portion of the surface of the semiconductor wafer is removed and thus a silicon surface of the semiconductor wafer is exposed at the outer peripheral portion.

When the semiconductor wafer in the above state is subjected to the subsequent mirror finish polishing, a polishing rate varies depending on the presence or absence of the oxide film on the surface of the semiconductor wafer as shown in FIG. 8B. Specifically, it has been found that a polishing rate for the outer peripheral portion, on which no oxide film is present, becomes higher, so that the outer peripheral portion is first polished and thus a severe edge roll-off is caused.

According to an aspect of the invention, a method of manufacturing a semiconductor wafer includes: rough-polishing front and back surfaces of the semiconductor wafer; mirror-polishing a chamfered portion of the rough-polished semiconductor wafer; performing mirror finish polishing on the front surface or both the front and back surfaces of the semiconductor wafer having the mirror-polished chamfered portion; and forming an oxide film on an entire surface of the semiconductor wafer after the mirror-polishing of the chamfered portion and before the mirror finish polishing.

In the above aspect, the oxide film is formed on the entire surface of the semiconductor wafer after the chamfered portion is mirror-polished, so that an outer peripheral portion of the surface of the semiconductor wafer, which is over-polished to be exposed, can be covered by the oxide film. Therefore, in the mirror finish polishing performed after the formation of the oxide film, the polishing rate does not vary depending on the presence or absence of the oxide film on the surface of the semiconductor wafer, which results in improvement in the flatness of the outer peripheral portion of the surface of the semiconductor wafer.

In the above aspect, it is preferable that the forming of the oxide film include chemical cleaning with a mixture of ammonia water and oxygenated water.

In the above aspect, the chemical cleaning with the mixture containing ammonia water and oxygenated water enables the rapid and uniform formation of the oxide film with an angstrom-order thickness on the surface of the semiconductor wafer.

In the above aspect, it is preferable that the forming of the oxide film include repeating spin cleaning with ozone water and spin cleaning with hydrogen fluoride water.

In the above aspect, the spin cleaning with ozone water and the spin cleaning with hydrogen fluoride water are repeated, thereby rapidly and uniformly forming the oxide film with an angstrom-order thickness on the surface of the semiconductor wafer.

In the above aspect, it is preferable that a thickness of the oxide film to be formed be in a range from 0.5 nm to 2 nm.

In the above aspect, as long as the thickness of the oxide film to be formed is in the range from 0.5 nm to 2 nm, an allowance for removal of the oxide film in the mirror finish polishing can be reduced.

In the above aspect, it is preferable that a polishing allowance for the mirror finish polishing be in a range from 0.1 μm to 3 μm.

In the above aspect, as long as the polishing allowance for the mirror finish polishing is in the range from 0.1 μm to 3 μm, a semiconductor wafer with high flatness and favorable surface roughness can be manufactured.

DESCRIPTION OF EMBODIMENT(S)

Exemplary embodiment(s) of the invention will be described below with reference to the attached drawings.

Figure 1:
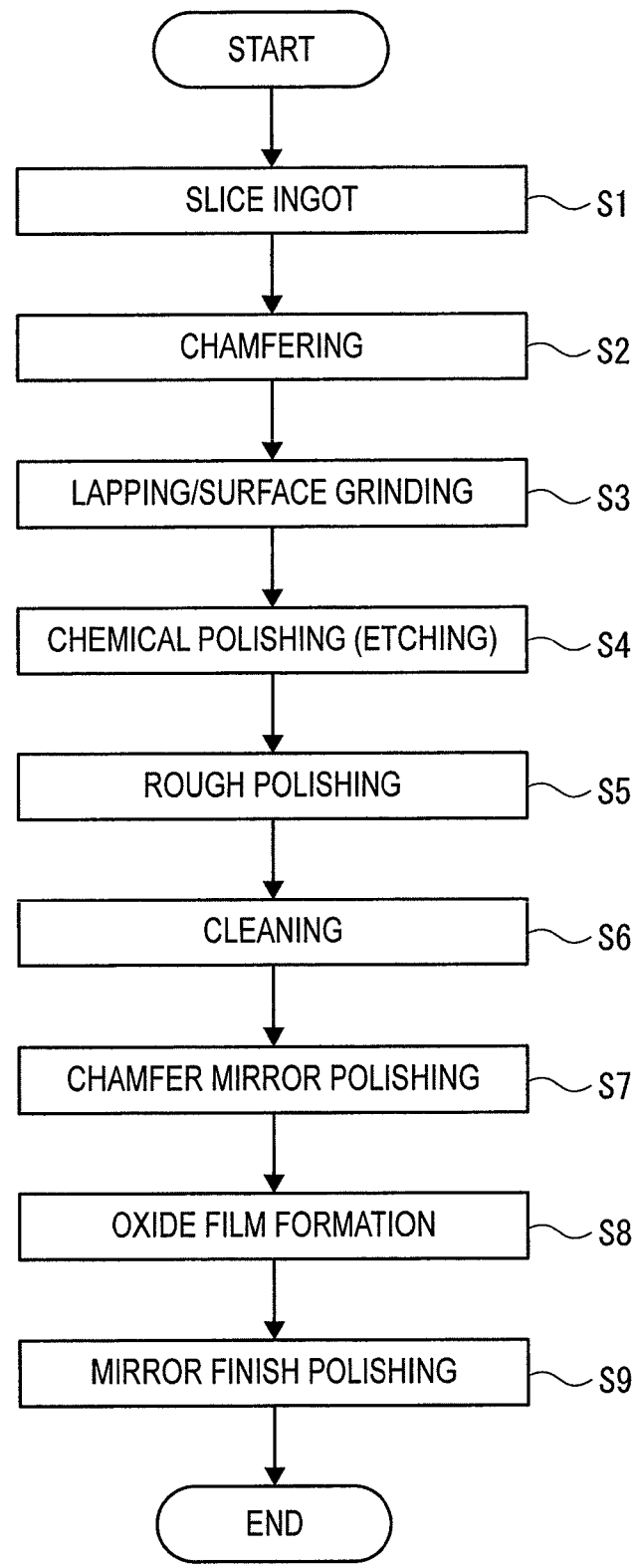
FIG. 1 is a flow chart showing a manufacturing process of a semiconductor wafer according to an exemplary embodiment of the invention.

FIG. 1 shows a manufacturing process of a semiconductor wafer according to an exemplary embodiment of the invention.

First, a monocrystal ingot pulled up by, for instance, a CZ method is sliced with, for instance, a multi wire saw (step S1). Subsequently, for instance, an edge of a wafer sliced from the ingot is chamfered to prevent the wafer from being cracked or broken (step S2).

Next, the chamfered wafer is subjected to lapping or surface grinding to flatten the surface of the wafer (step S3). The wafer is then subjected to a chemical polishing (i.e., etching) to remove a layer affected by the chamfering and lapping and remaining on the wafer (step S4).

Rough Polishing Step S5

Next, after subjected to etching, both front and back surfaces of the semiconductor wafer are rough-polished.

The rough polishing step S5 is intended to polish the semiconductor wafer until a desired thickness is achieved. Specifically, the semiconductor wafer is polished with a hard polishing cloth, which is made of a hardened urethane resin or the like, at a relatively high polishing rate so that unevenness in thickness of the polished semiconductor wafer is reduced (i.e., the semiconductor wafer is flattened).

In the rough polishing step S5, a predetermined polishing allowance may be divided into a plurality of layers (e.g., first to third layers), each of which is polished with a different type of polishing cloth and different-sized loose abrasive grains. Alternatively, non-abrasive polishing with an alkaline solution containing no loose abrasive grains may be performed.

Arrangement of Double-Side Polishing Machine

Description will be made on a double-side polishing machine used in the rough polishing step S5 according to the exemplary embodiment.

Figure 2:
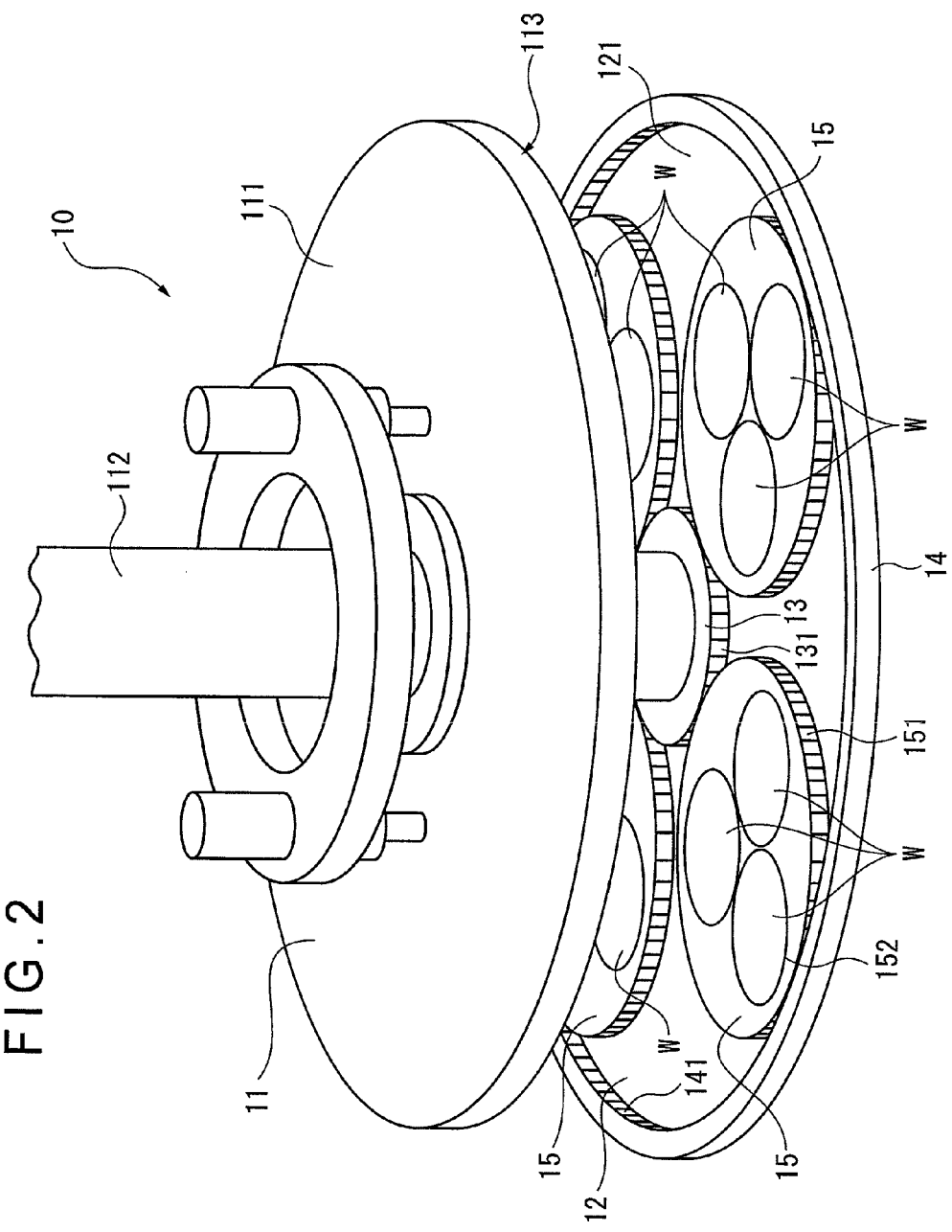
FIG. 2 is a schematic view showing an arrangement of a double-side polishing machine according to the exemplary embodiment.

As shown in FIG. 2, a double-side polishing machine 10 includes an upper platen 11, a lower platen 12, an inner gear 13, an outer gear 14 and a plurality of carriers 15. In the carriers 15, a plurality of semiconductor wafers W are set. In FIG. 2, three of the semiconductor wafers W are set in each of the carriers 15.

The upper platen 11 includes a platen body 111 and an elevation mechanism 112 for moving the platen body 111 toward or away from the lower platen 12.

The platen body 111 is substantially in the form of a disc and includes a polishing pad 113 (not shown in FIG. 2). The polishing pad 113 is provided to a lower surface of the platen body 111 and is brought into contact with surfaces of the semiconductor wafers W to polish the semiconductor wafers W. A plurality of supply holes are formed through an upper surface of the platen body 111 to supply a polishing slurry and pure water for rinsing between the upper platen 11 and the lower platen 12 during polishing.

The elevation mechanism 112, which includes a shaft provided substantially at the center of the platen body 111, is driven by a motor provided on a portal frame (not shown) disposed above to vertically move the platen body 111.

The lower platen 12, which is in the form of a disc body rotatably provided on a mount of the double-side polishing machine 10, has a surface that is opposite to the upper platen 11 and is provided with a polishing pad 121. In polishing, the lower polishing pad 121 is brought into contact with the surfaces of the semiconductor wafers W.

The inner gear 13 is provided substantially at the center of the disc-shaped lower platen 12 and is rotatable independently of the lower platen 12. An outer lateral surface of the inner gear 13 is provided with gear teeth 131 meshed with the carriers 15.

The outer gear 14 is a ring body surrounding the lower platen 12, an inner lateral surface of which is provided with gear teeth 141 meshed with the carriers 15.

The upper platen 11, the lower platen 12, the inner gear 13 and the outer gear 14 are linked to rotation shafts of separate driving motors at their rotation centers to be rotated by the driving motors independently of one another.

The carriers 15 are each in the form of a disc body, an outer lateral surface of which is provided with gear teeth 151 meshed with the inner gear 13 and the outer gear 14. An in-plane area of the disc body is provided with a plurality of wafer holding holes 152, in which the semiconductor wafers W are set.

A polishing cloth attached to each of the polishing pad 113 and the polishing pad 121 is preferably made of a polyurethane. A polyurethane with a Shore A hardness in a range from 80 to 90 is particularly preferable. A polishing solution is preferably an alkaline aqueous solution containing abrasive grains. Specifically, it is particularly preferable that the abrasive grains be colloidal silica with an average grain size of 50 nm and the alkaline aqueous solution be a KOH aqueous solution with a pH of 10 to 11.

Operation of Double-side Polishing Machine in Rough Polishing Step S5

Next, description will be made on a rough-polishing operation of the double-side polishing machine 10.

First, the carriers 15 are set on the lower platen 12 and the semiconductor wafers W are set in the wafer holding holes 152. Next, double-side polishing is performed by: moving down the upper platen 11 by the elevation mechanism 112; and driving the driving motors while pressing the upper platen 11 downward with a predetermined pressure and supplying a polishing slurry through the supply holes formed through the platen body 111 of the upper platen 11.

Since the gear teeth 151 on the outer lateral surface of each of the carriers 15 are meshed with the inner gear 13 and the outer gear 14, the carriers 15 each rotate around the inner gear 13 while rotating on its own axis during the polishing, so that the semiconductor wafers W are polished by the entire polishing pad 113 and polishing pad 121.

Incidentally, the semiconductor wafers W are disposed with their front surfaces facing downward and their back surfaces facing upward, so that the polishing pad 121 attached to the lower platen 12 is used for polishing the front surfaces of the semiconductor wafers W and the polishing pad 113 attached to the upper platen 11 is used for polishing the back surfaces of the semiconductor wafers W.

Figure 6:
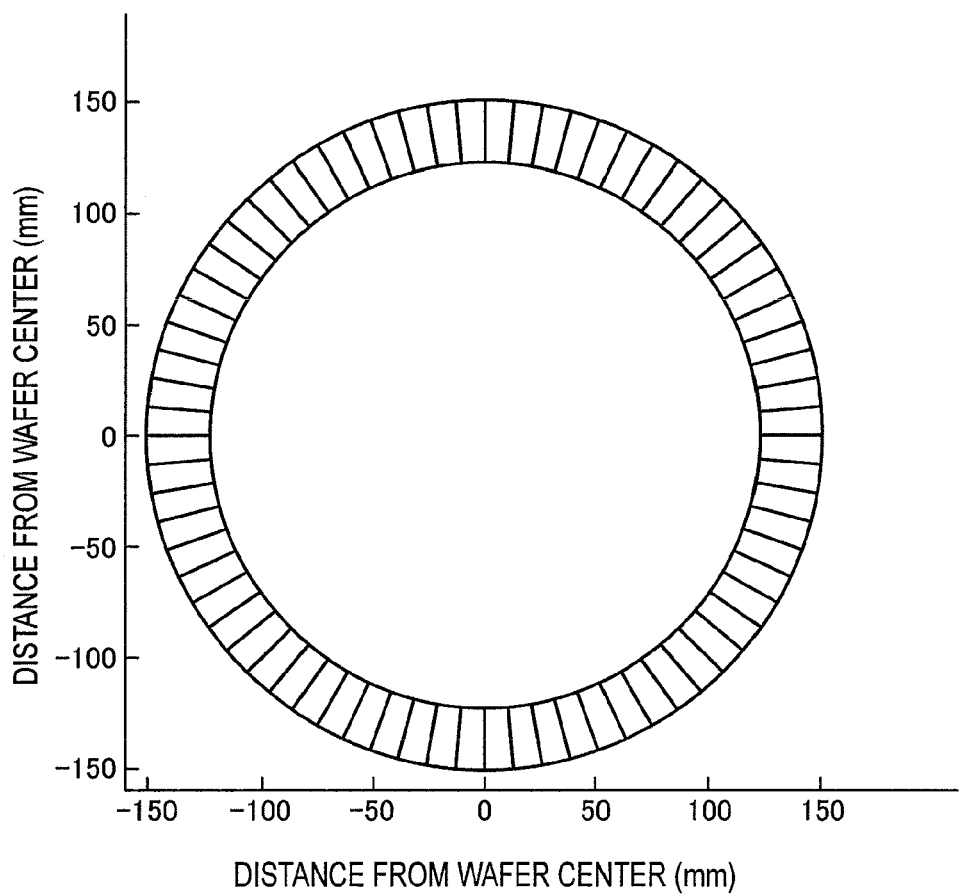
FIG. 6 is an overall view showing the SFQR of the semiconductor wafer according to the exemplary embodiment.

The polishing allowance for the rough polishing step S5 is preferably 10 μm for one surface (i.e., approximately 20 μm for both surfaces in total). Further, the polishing allowance is favorably adjusted so that ESFQR (Edge flatness metric, Sector based, Front surface referenced, least sQuares fit reference plane, Range of the data within sector) of each of the semiconductor wafers W falls within a range from 30 to 50 nm after the rough polishing step S5. Incidentally, ESFQR is a measurement value of SFQR (Site Front least sQuares Range) in each sectorial area (sector) defined in an outer edge portion along the entire circumference of each wafer as shown in FIG. 6.

Cleaning Step S6

Next, after being subjected to the rough polishing step S5, the semiconductor wafers W are cleaned.

After the rough polishing step S5, for instance, the abrasive grains and the polishing solution used for the rough polishing step S5 remain on the surfaces of the semiconductor wafers W. A polishing solution used for a mirror finish polishing step S9 (described later) is different in abrasive grain size and compositional elements from the polishing solution used for the rough polishing step S5. Therefore, in the step S6, the semiconductor wafers W are cleaned so that the semiconductor wafers W are not subjected to the subsequent mirror finish polishing step S9 with the abrasive grains and the polishing solution remaining thereon.

For the cleaning, for instance, a cleaning solution (SC-1) containing ammonia water and oxygenated water is favorably usable. For instance, the semiconductor wafers W are particularly preferably subjected to wet-bench cleaning with an SC-1 solution heated to 50 to 80 degrees C., the SC-1 solution being prepared by blending ammonia water and oxygenated water at a ratio of 1:1 and diluting the mixture with pure water by 5 to 30 times.

After being cleaned with the SC-1 solution, the semiconductor wafers W are rinsed with pure water. On the entire surfaces of the cleaned semiconductor wafers W, a native oxide film with a thickness in a range from approximately 1 nm to approximately 1.1 nm (in a range from approximately 10 Å to approximately 11 Å) is necessarily formed.

Chamfer Mirror Polishing Step S7

Next, after being subjected to the cleaning step S6, chamfered portions of the semiconductor wafers W are mirror-polished.

In the step S7, the chamfered portions of the semiconductor wafers W are mirror-polished in order to prevent generation of dust from the chamfered portions and to remove scars and dents of the chamfered portions formed as a result of contact between the semiconductor wafers W and inner lateral surfaces of the carriers in the rough polishing step S5.

Arrangement of Chamfer-Polishing Machine

Figure 3A:
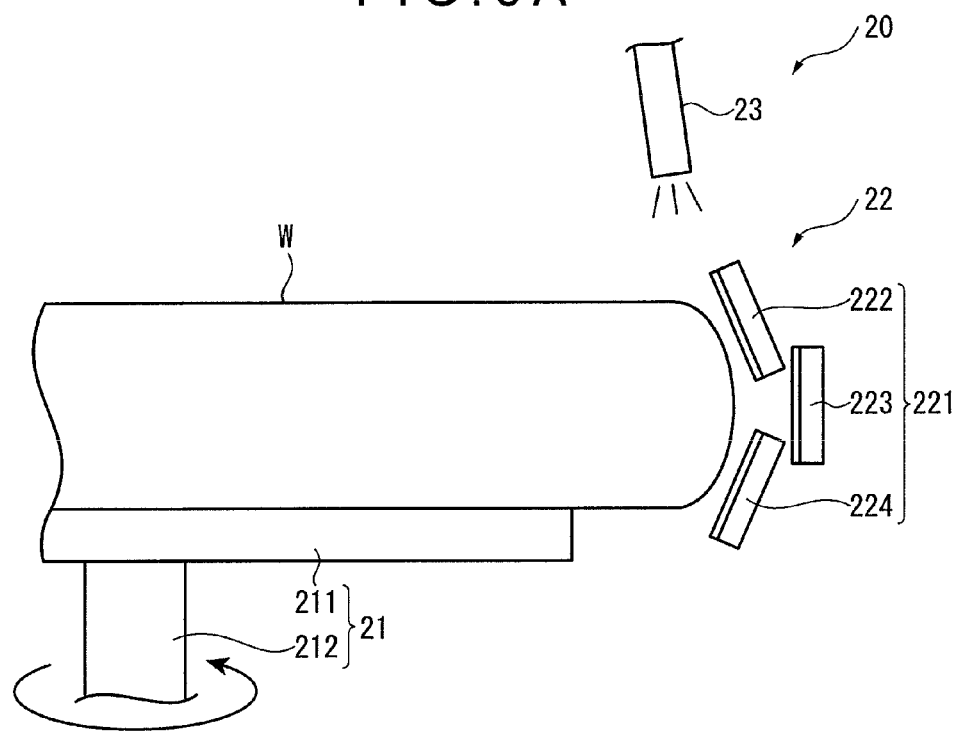
FIG. 3A is a partially enlarged schematic view showing a chamfer-polishing machine according to the exemplary embodiment.
Figure 3B:
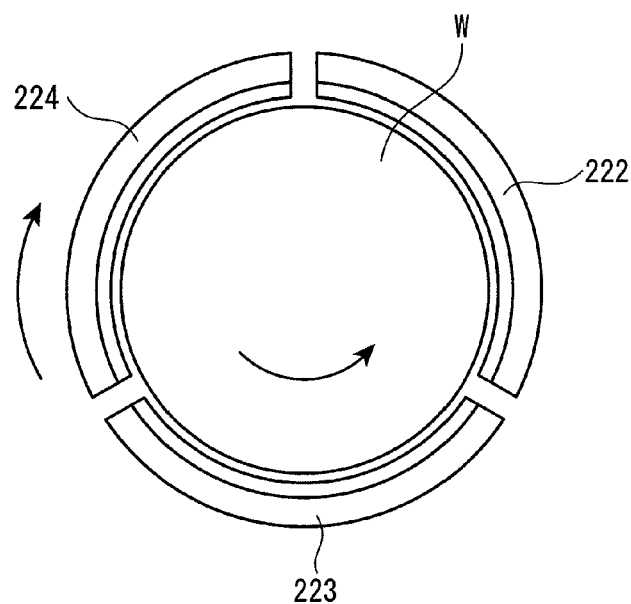
FIG. 3B is a plan view showing the chamfer-polishing machine according to the exemplary embodiment.

Description will be made on a chamfer-polishing machine used in the chamfer mirror polishing step S7 according to the exemplary embodiment. FIG. 3A is a partially enlarged schematic view showing the chamfer-polishing machine. FIG. 3B is a plan view showing the chamfer-polishing machine.

As shown in FIG. 3A, a chamfer-polishing machine 20 includes: a wafer suction unit 21 that sucks the lower surface of the semiconductor wafer W to be polished; a polishing unit 22 that mirror-polishes the semiconductor wafer W sucked by the wafer suction unit 21; and a pipe 23 that is disposed above the polishing unit 22 to supply a polishing solution.

The wafer suction unit 21 includes: a suction stage 211 (i.e., a holder) that sucks and holds the lower surface of the semiconductor wafer W; and a rotor 212 that rotates the suction stage 211.

The polishing unit 22 includes: a polishing wheel 221 that mirror-polishes the chamfered portion of the semiconductor wafer W; and a driver (not shown) that rotates the polishing wheel 221, vertically moves the polishing wheel 221 and presses the polishing wheel 221 onto the semiconductor wafer W. The polishing wheel 221 includes an upper-slant polishing pad 222, a vertical-surface polishing pad 223 and a lower-slant polishing pad 224.

Incidentally, although FIG. 3A shows that the polishing pads are arranged on the right side in the figure to clarify a positional relationship of the polishing pads with the chamfered portion of the semiconductor wafer W, the polishing pads are actually in the arc shapes with the same length and arranged around the semiconductor wafer W to be polished at predetermined intervals as shown in FIG. 3B.

The polishing pads are each attached with a polishing cloth. The polishing cloth attached to each of the polishing pads of the chamfer-polishing machine 20 is preferably made of a nonwoven fabric. A nonwoven fabric having an Asker C hardness in a range from 55 to 56 is particularly preferable. The polishing solution is preferably an alkaline aqueous solution containing abrasive grains. Specifically, it is particularly preferable that the abrasive grains be colloidal silica with an average grain size of 50 nm and the alkaline aqueous solution be a KOH aqueous solution with a pH of 10 to 11.

Operation of Chamfer-polishing Machine in Chamfer Mirror Polishing Step S7

Next, description will be made on an operation of the chamfer-polishing machine 20 in the chamfer mirror polishing step.

The wafer suction unit 21 sucks the lower surface of the semiconductor wafer W to be polished to hold the semiconductor wafer W. The polishing pads 222, 223, 224 of the polishing wheel 221 are each pressed against a predetermined spot on the chamfered portion and kept pressed.

Next, while the polishing solution is supplied to the polishing cloth from the pipe 23, the rotor 212 is driven to rotate the semiconductor wafer W and, simultaneously, the polishing wheel 221 is rotated by the driver to rotate the polishing pads 222, 223, 224, as shown in FIG. 3B.

In this manner, an upper portion, a middle portion and a lower portion of the chamfered portion of the semiconductor wafer W are respectively polished by the upper-slant polishing pad 222, the vertical-surface polishing pad 223 and the lower-slant polishing pad 224.

Figure 4A:
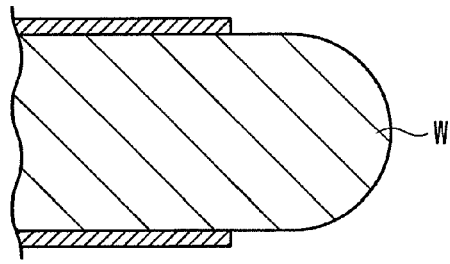
FIG. 4A is a partially enlarged sectional view of the semiconductor wafer in the manufacturing process according to the exemplary embodiment, showing the appearance of the semiconductor wafer with a chamfered portion being mirror-polished.
Figure 4A:

As a result of the chamfer mirror polishing, the oxide film present on the chamfered portion is removed and the chamfered portion is polished to have a mirrored surface, as shown in FIG. 4A. Further, scars and dents formed in the rough polishing step S5 are removed.

While the oxide film present on the chamfered portion is removed, the oxide film present on the outer peripheral portions of both front and back surfaces is also removed as a result of over-polishing with a silicon surface being exposed on the outer peripheral portions.

Oxide Film Forming Step S8

Figure 4B:
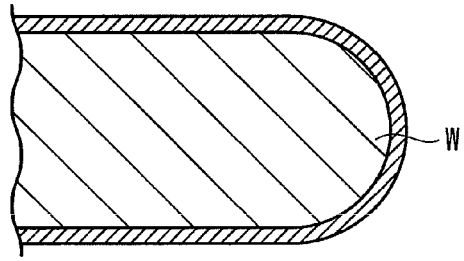
FIG. 4B is a partially enlarged sectional view of the semiconductor wafer in the manufacturing process according to the exemplary embodiment, showing the appearance of the semiconductor wafer on which an oxide film has been formed.
Figure 4B:

Next, after the chamfer mirror polishing step S7, another oxide film is formed to cover the entire surface of the semiconductor wafer W as shown in FIG. 4B.

The oxide film is formed to cover the entire surface of the semiconductor wafer W in the step S8 in order to eliminate a variation in polishing rate depending on the presence or absence of the oxide film in a mirror finish polishing step S9 (described later).

The oxide film is preferably formed by chemical cleaning with a mixture (SC-1) of ammonia water and oxygenated water. Such chemical cleaning of the semiconductor wafer W is particularly preferably wet-bench cleaning with an SC-1 solution heated to 50 to 80 degrees C., the SC-1 solution being prepared by blending ammonia water and oxygenated water at a ratio of 1:1 and diluting the mixture with pure water by 5 to 30 times in the same manner as the above cleaning step.

After being cleaned with the SC-1 solution, the semiconductor wafer W is rinsed with pure water. On the entire surface of the cleaned semiconductor wafer W, a native oxide film with a thickness in a range from approximately 1 nm to approximately 1.1 nm (in a range from approximately 10 Å to approximately 11 Å) is necessarily formed.

The oxide film is also preferably formed by repeating spin cleaning with ozone water and spin cleaning with hydrogen fluoride water. The spin cleaning is performed by, for instance, a single-wafer spin processor.

In the spin cleaning according to the exemplary embodiment, spin cleaning with ozone water and spin cleaning with hydrogen fluoride water are repeated. In other words, different types of spin cleaning with different cleaning solutions are alternately performed. In this manner, the front surface and the chamfered portion of the semiconductor wafer W are cleaned and the oxide film is formed on the surface and the chamfered portion of the semiconductor wafer W. Every time after the spin cleaning with each cleaning solution, the semiconductor wafer W is preferably rinsed with pure water.

After the completion of the spin cleaning of the front surface, the semiconductor wafer W is rinsed with pure water and then turned back to front so that the spin cleaning is likewise performed on the back surface. Upon the completion of the spin cleaning of the semiconductor wafer W, a native oxide film with a thickness in a range from 0.8 nm to 1.2 nm is to be formed on the entire surface of the semiconductor wafer W.

Mirror Finish Polishing Step S9

Finally, after the oxide film is formed on the entire surface of the semiconductor wafer W in the step S8, the front surface or both front and back surfaces of the semiconductor wafer W are mirror-polished.

A mirror finish polishing step S9 is intended to improve the surface roughness of the semiconductor wafer W. Specifically, the semiconductor wafer W is polished with a soft polishing cloth such as suede cloth in combination with fine loose abrasive grains to reduce the unevenness in fine surface roughness of the surface of the semiconductor wafer W (e.g., micro roughness and haze).

In the mirror finish polishing step S9, a predetermined polishing allowance may be divided into a plurality of layers, each of which is polished with a different type of polishing cloth and different-sized loose abrasive grains in the same manner as in the rough polishing step S5.

Arrangement of Single-Side Polishing Machine

Description will be made on a single-side polishing machine used in the mirror finish polishing step S9 according to the exemplary embodiment.

Figure 5:
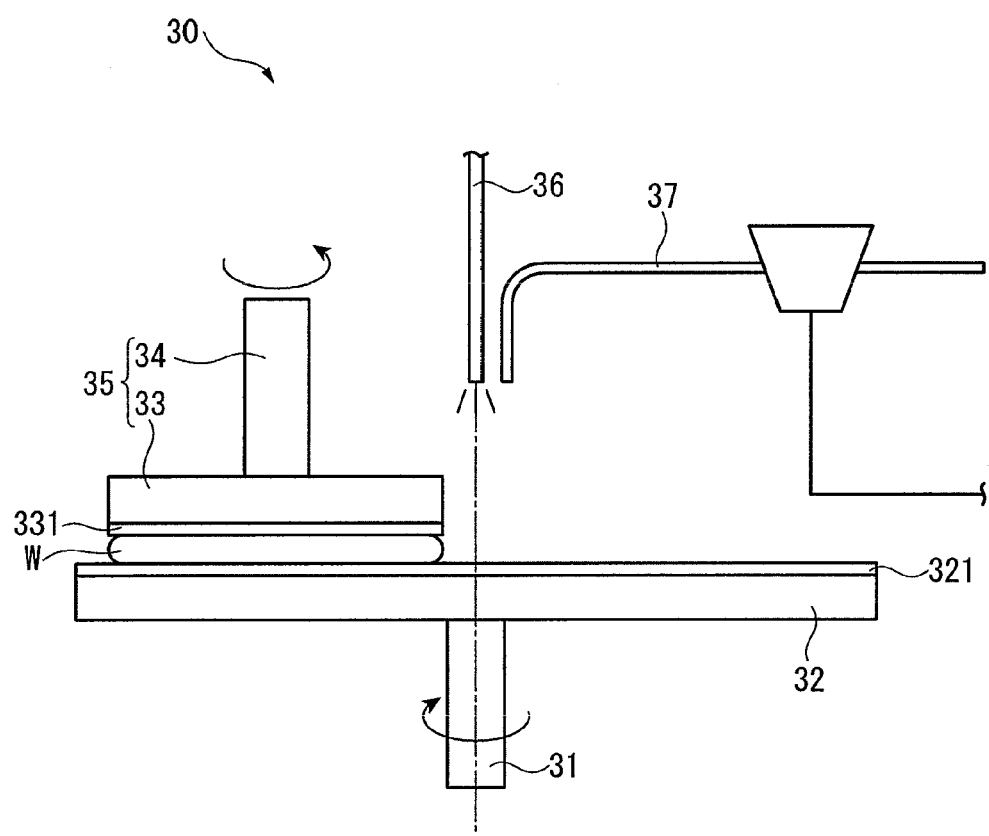
FIG. 5 is a schematic view showing a single-side polishing machine according to the exemplary embodiment.

As shown in FIG. 5, a single-side polishing machine 30, which is in the form of a large disc, includes: a shaft 31 connected to the center of a bottom surface of the disc; a rotary platen 32 rotated by the shaft 31; and a wafer holder 35 that includes a pressurizing head 33 and a shaft 34 connected to the pressurizing head 33 to rotate the pressurizing head 33.

An upper surface of the rotary platen 32 is attached with a polishing cloth 321. A lower surface of the pressurizing head 33 is provided with a polishing plate 331 to which the semiconductor wafer W to be polished is fixed. A pipe 36 for supplying a polishing solution and a pipe 37 for supplying pure water are disposed above the rotary platen 32.

The polishing cloth 321 attached to the single-side polishing machine 30 is preferably suede cloth. The polishing solution is preferably an alkaline aqueous solution containing abrasive grains. Specifically, it is particularly preferable that the abrasive grains be colloidal silica with an average grain size of 35 nm and the alkaline aqueous solution be an ammonia aqueous solution with a pH of 10.2 to 10.8.

Incidentally, the polishing solution used in the single-side polishing machine 30 may contain abrasive grains such as colloidal silica or may not contain abrasive grains.

Operation of Single-side Polishing Machine in Mirror Finish Polishing Step S9

Next, description will be made on an operation of the single-side polishing machine 30 in the mirror finish polishing step.

First, the back surface of the semiconductor wafer W to be polished is fixed to the polishing plate 331 of the pressurizing head 33 to hold the semiconductor wafer W. The pressurizing head 33 is then moved down and pressed downward with a predetermined pressure, thereby pressing the front surface of the semiconductor wafer W against the polishing cloth 321.

Next, while the polishing solution is supplied from the pipe 36 to the polishing cloth 321, against which the semiconductor wafer W is kept pressed, the pressurizing head 33 is rotated to rotate the semiconductor wafer W and, simultaneously, the rotary platen 32 is rotated to rotate the polishing cloth 321.

In this manner, the front surface of the semiconductor wafer W is polished with the polishing cloth 321.

Figure 4C:
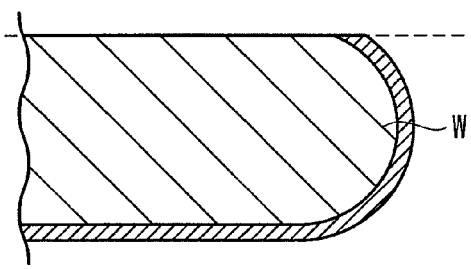
FIG. 4C is a partially enlarged sectional view of the semiconductor wafer in the manufacturing process according to the exemplary embodiment, showing the appearance of the semiconductor wafer on which mirror finish polishing has been performed.

As shown in FIG. 4C, as a result of the mirror finish polishing, the front surface of the semiconductor wafer W is polished into a mirrored surface with the oxide film remaining on the front surface of the semiconductor wafer W being removed.

The polishing allowance for the mirror finish polishing step S9 is preferably in a range from 0.1 μm to 3 μm and particularly preferably in a range from 0.3 μm to 0.7 μm. When the semiconductor wafer W is polished by the predetermined polishing allowance, pure water is supplied from the pipe 37 to remove the polishing solution that is previously supplied.

Incidentally, for the mirror finish polishing of both front and back surfaces of the semiconductor wafer W, after the completion of the one-side polishing of the front surface, the semiconductor wafer W is rinsed with pure water and then turned back to front so that the one-side polishing is likewise performed on the back surface. In this case, polishing conditions for the front surface are preferably different from polishing conditions for the back surface so that the front and back surfaces can be distinguished depending on a difference in glossiness between the resulting mirrored surfaces.

Advantages of Exemplary Embodiment

As described above, the above exemplary embodiment can provide the following advantages.

(1) In the exemplary embodiment, after the chamfer mirror polishing step S7, the entire surface of the semiconductor wafer W is covered by the oxide film in the step S8, and then the mirror finish polishing step S9 is performed.

Therefore, even when the outer peripheral portion of the surface of the semiconductor wafer W is exposed as a result of over-polishing in the chamfer mirror polishing step S7, the outer peripheral portion can be covered by the oxide film. As a result, the polishing rate does not vary depending on the presence or absence of the oxide film on the surface of the semiconductor wafer W in the mirror finish polishing step S9, so that the flatness of the outer peripheral portion of the surface of the semiconductor wafer W can be improved.

(2) In the step S8, the oxide film is formed by the chemical cleaning with the mixture containing ammonia water and oxygenated water.

The chemical cleaning with the mixture containing ammonia water and oxygenated water enables the rapid and uniform formation of the oxide film with an angstrom-order thickness on the surface of the semiconductor wafer W.

(3) In the step S8, the oxide film is formed by repeating the spin cleaning with ozone water and the spin cleaning with hydrogen fluoride water.

The spin cleaning with the ozone water and the spin cleaning with the hydrogen fluoride water are repeated, thereby rapidly and uniformly forming the oxide film with an angstrom-order thickness on the surface of the semiconductor wafer W.

(4) In the step S8, the thickness of the oxide film to be formed is in the range from 0.5 nm to 2 nm.

As long as the thickness of the oxide film to be formed is in the range from 0.5 nm to 2 nm, an allowance for removal of the oxide film in the mirror finish polishing can be reduced.

(5) The polishing allowance for the mirror finish polishing step S9 is in the range from 0.1 μm to 3 μm.

As long as the polishing allowance for the mirror finish polishing step S9 is in the range from 0.1 μm to 3 μm, the semiconductor wafer W can have high flatness and favorable surface roughness.

Other Exemplary Embodiment(s)

It should be appreciated that the scope of the invention is not limited to the above exemplary embodiment but various improvements and design changes that are compatible with an object of the invention are included within the scope of the invention.

For instance, after the chamfer mirror polishing step S7, another oxide film may be formed on the entire surface of the semiconductor wafer W after the oxide film remaining on the surface of the semiconductor wafer W is completely removed by immersing the semiconductor wafer W in a hydrofluoric acid solution. In the above case, after the remaining oxide film is completely removed after the chamfer mirror polishing step S7, another oxide film is formed on the entire surface of the semiconductor wafer W in the step S8. Therefore, the polishing rate hardly varies in the mirror finish polishing step S9, so that the flatness of the outer peripheral portion of the surface of the semiconductor wafer W can be further improved.

Regarding the machine used in the rough polishing step S5, each of the carriers 15 of the double-side polishing machine 10 shown in FIG. 2 may be provided with one wafer holding hole (i.e., single-wafer type) or a plurality of wafer holding holes. The size of the wafer holding hole(s) may be appropriately adjusted depending on the size of the semiconductor wafer(s) W to be polished.

In the rough polishing step S5, the double-side polishing machine 10 shown in FIG. 2 may be replaced by the single-side polishing machine 30 shown in FIG. 5 to separately rough-polish the front and back surfaces of the wafer.

The chamfer-polishing machine used for mirror-polishing the chamfered portion may be provided with an oxide-film-forming mechanism. Alternatively, dedicated equipment may be used to form the oxide film after the chamfered portion is mirror-polished. Alternatively, the semiconductor wafer W may be subjected to an oxide-film-forming mechanism before being subjected to the mirror finish polishing performed by the single-side polishing machine.

Specific procedures for actually carrying out the invention, arrangements and the like may be modified as long as an object of the invention can be achieved.

EXAMPLES

Next, the exemplary embodiment will be described in further detail with reference to Examples and Comparative Example, but the invention is not limited thereto.

Example 1

A boron-doped silicon wafer with a diameter of 300 mm and crystal orientation (100) was prepared as the semiconductor wafer W.

Front and back surfaces of the silicon wafer were first rough-polished by the double-side polishing machine 10 shown in FIG. 2 to adjust the ESFQR of the rough-polished silicon wafer to a range from 30 to 50 nm. For the double-side polishing machine 10, a polishing cloth was a polyurethane with a Shore A hardness in a range from 80 to 90 and a polishing solution was a KOH aqueous solution with a pH of 10 to 11 that contained colloidal silica with an average particle size of 50 nm. A polishing allowance for the rough polishing was 10 μm for one surface (i.e., approximately 20 μm for both surfaces in total).

Next, the rough-polished silicon wafer was subjected to wet-bench cleaning with an SC-1 solution. The SC-1 solution was prepared by blending ammonia water and oxygenated water at a ratio of 1:1 and diluting the mixture with pure water by 5 to 30 times and was heated to 50 to 80 degrees C.

Next, a chamfered portion of the cleaned silicon wafer was mirror-polished by the chamfer-polishing machine 20 shown in FIGS. 3A and 3B. For the chamfer-polishing machine 20, a polishing cloth was nonwoven cloth with an Asker C hardness in a range from 55 to 56 and a polishing solution was a KOH aqueous solution with a pH of 10 to 11 that contained colloidal silica abrasive grains with an average particle size of 50 nm.

Next, after the chamfered portion was mirror-polished, the silicon wafer was subjected to wet-bench cleaning with an SC-1 solution to form an oxide film on the entire surface of the silicon wafer. The SC-1 solution was prepared by blending ammonia water and oxygenated water at a ratio of 1:1 and diluting the mixture with pure water by 5 to 30 times and was heated to 50 to 80 degrees C. The formed oxide film had a thickness of approximately 1.1 nm (approximately 11 Å).

Finally, the silicon wafer was subjected to mirror finish polishing performed by the single-side polishing machine 30 shown in FIG. 5 until a polishing allowance of the surface of the silicon wafer, on which the oxide film is formed, became 0.5 μm. For the single-side polishing machine 30, a polishing cloth was suede cloth and a polishing solution was an ammonia aqueous solution with a pH of 10.2 to 10.8 that contained colloidal silica abrasive grains with an average particle size of 35 nm.

Example 2

In Example 2, the semiconductor wafer W was manufactured in the same manner as in Example 1 except that the oxide film was formed on the entire surface of the silicon wafer by repeating spin cleaning with ozone water and spin cleaning with hydrogen fluoride water.

Comparative Example 1

In Comparative Example 1, the semiconductor wafer W was manufactured in the same manner as in Example 1 except that no oxide film was formed on the silicon wafer before the mirror finish polishing was performed.

Evaluation

A plurality of silicon wafers of each of Examples 1 and 2 and Comparative Example 1 were prepared and ESFQR was calculated by a flatness measuring instrument (manufactured by KLA-Tencor Corporation: WaferSight). As shown in FIG. 6, a sector (site size) was defined as follows: an edge extension was 1 mm; the whole wafer circumference was divided every 5 degree into 72 segments; and a sector length (i.e., a length of a radial side) of each sector was 30 mm. Incidentally, ESFQRmax stands for the maximum value of the ESFQR values of all the sectors on the wafer and ESFQRmean stands for the average value of the ESFQR values of all the sectors. The results are shown in FIG. 7.

Figure 7:
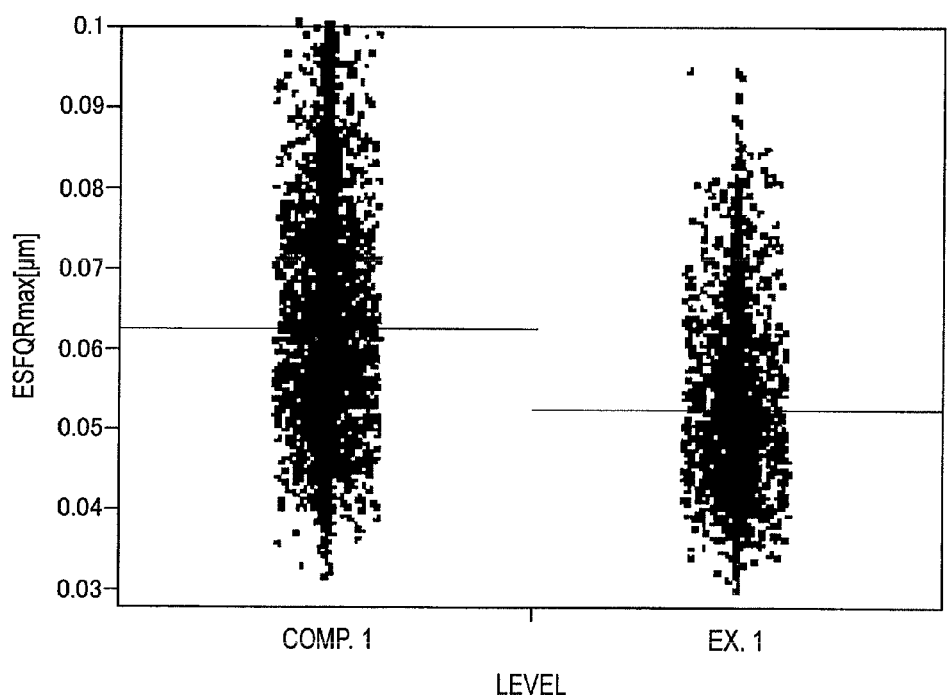
FIG. 7 shows ESFQR-analysis results of Example 1 and Comparative Example 1.
Figure 8A:
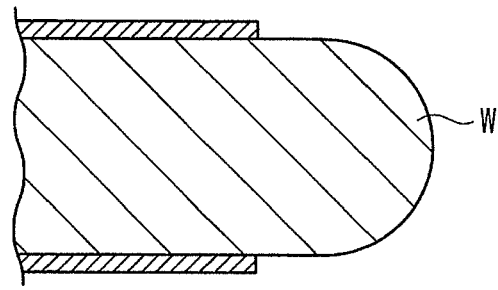
FIG. 8A is a partially enlarged sectional view of a semiconductor wafer in a typical manufacturing process, showing the appearance of the semiconductor wafer with a chamfered portion being mirror-polished.
Figure 8B:
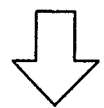
FIG. 8B is a partially enlarged sectional view of the semiconductor wafer in the typical manufacturing process, showing the appearance of the semiconductor wafer on which mirror finish polishing is performed.
Figure 8B:
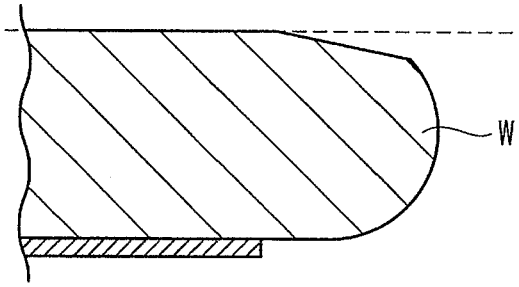

As shown in FIG. 7, in view of the result that the ESFQRmean of Example 1 was approximately 0.051 μm and the ESFQRmean of Comparative Example 1 was approximately 0.062 μm, Example 1 was improved in ESFQR quality by approximately 0.01 μm as compared with Comparative Example 1.

Similarly, Example 2 was also improved in ESFQR quality by approximately 0.01 μm as compared with Comparative Example 1 (the result of Example 2 is not shown in FIG. 7).

In view of the above results, it has been proven that the manufacturing method according to the invention improves edge roll-off to enhance the flatness of the outer peripheral portion of the surface of a wafer.

The invention claimed is:

1. A method of manufacturing a semiconductor wafer, the method comprising:
    rough-polishing front and back surfaces of the semiconductor wafer;
    mirror-polishing a chamfered portion of the rough-polished semiconductor wafer;
    performing mirror finish polishing on the front surface or both the front and back surfaces of the semiconductor wafer having the mirror-polished chamfered portion; and
    forming a subsequent oxide film on an entire surface of the semiconductor wafer after an initial oxide film remaining on the surface of the semiconductor wafer is completely removed,
    the initial oxide film being completely removed after the mirror-polishing of the chamfered portion, and
    the subsequent oxide film being formed before the mirror finish polishing.

2. The method of manufacturing the semiconductor wafer according to claim 1, wherein the forming of the subsequent oxide film comprises chemical cleaning with a mixture of ammonia water and oxygenated water.

3. The method of manufacturing the semiconductor wafer according to claim 1, wherein the forming of the subsequent oxide film comprises repeating spin cleaning with ozone water and spin cleaning with hydrogen fluoride water.

4. The method of manufacturing the semiconductor wafer according to claim 1, wherein a thickness of the subsequent oxide film to be formed is in a range from 0.5 nm to 2 nm.

5. The method of manufacturing the semiconductor wafer according to claim 1, wherein a polishing allowance for the mirror finish polishing is in a range from 0.1 μm to 3 μm.

\* \* \* \* \*